United States Patent [19]

Jallen

[11] Patent Number: 4,530,072
[45] Date of Patent: Jul. 16, 1985

[54] BUBBLE MEMORY BIAS FIELD STRUCTURE

[75] Inventor: Gale A. Jallen, Roseville, Minn.

[73] Assignee: Control Data Corporation, Minneapolis, Minn.

[21] Appl. No.: 102,096

[22] Filed: Dec. 10, 1979

[51] Int. Cl.³ .............................................. G11C 19/08
[52] U.S. Cl. .......................................... 365/27; 365/2
[58] Field of Search ................... 365/2, 27, 28, 62; 335/302, 303

[56] References Cited

U.S. PATENT DOCUMENTS 3,213,335  10/1965  Bourne ............................. 335/303
3,864,671   2/1975  Myer ................................. 365/2
4,091,362   5/1978  Chen ................................. 365/28

FOREIGN PATENT DOCUMENTS 2811088  9/1978  Fed. Rep. of Germany ........ 365/27

OTHER PUBLICATIONS

IBM Technical Disclosure Bulletin-vol. 13, No. 11, Apr. 1971; p. 3219.

Primary Examiner—James W. Moffitt
Attorney, Agent, or Firm—William J. McGinnis, Jr.; Joseph A. Genovese

[57] ABSTRACT

In a bubble memory package, a contoured, shaped magnet and filler plate combination is provided to shape the magnetic field in a uniform fashion to prevent the loss of magnetic flux density which normally tends to occur in the center of the magnet area of a planar, uniformly thick magnet.

2 Claims, 3 Drawing Figures

BUBBLE MEMORY BIAS FIELD STRUCTURE

BACKGROUND OF THE INVENTION

This invention relates to the packaging structure required to contain an operative bubble memory device. In particular, this invention relates to a magnet having variations in effective thickness such as a shaped plate magnet which helps improve the uniformity of magnetic flux density thereby improving the operative characteristics of a magnetic bubble device.

This invention shows an improvement in magnet structure which may apply to the structure shown in U.S. Pat. No. 4,150,440. However, the structure of the present invention may also be used with other bubble memory structures than that shown in the patent.

SUMMARY OF THE INVENTION

The present invention consists of a magnet having a non-uniform effective thickness to enhance certain regions of magnetic flux density. One embodiment is a contoured plate magnet which helps shape and control the magnetic bias field locally in a bubble memory structure to create a more uniform field at the bubble chip. In particular, one embodiment is a structured magnet that has the characteristic that it more closely approaches the coils for generating the rotating magnetic field and the bubble memory chip at the center of the magnet area than at a region partially between the edge and the center. Another embodiment of the invention provides for the placement of a filler plate of an appropriate shape between the magnet and the outer structure of the bubble memory package. The magnet is then shaped to follow the contour of the filler plate and is placed nearest the coils for generating the magnetic field. The magnet may actually have a uniform thickness but its effective thickness is varied as a result of the shaping to follow the filler plate and more closely approach the bubble chip at certain points. The prior art leveling plate structure is not required in the present invention.

IN THE FIGURES:

FIG. 1 is a showing of a cross-sectional view of a magnetic bubble memory structure according to the prior art, FIG. 2 is a showing of a partial cross-sectional view of a bubble showing an embodiment of the present invention, and FIG. 3 is a partial cross-sectional view showing another embodiment of the present invention.

DESCRIPTION OF THE PREFERRED EMBODIMENTS

Figure 1:
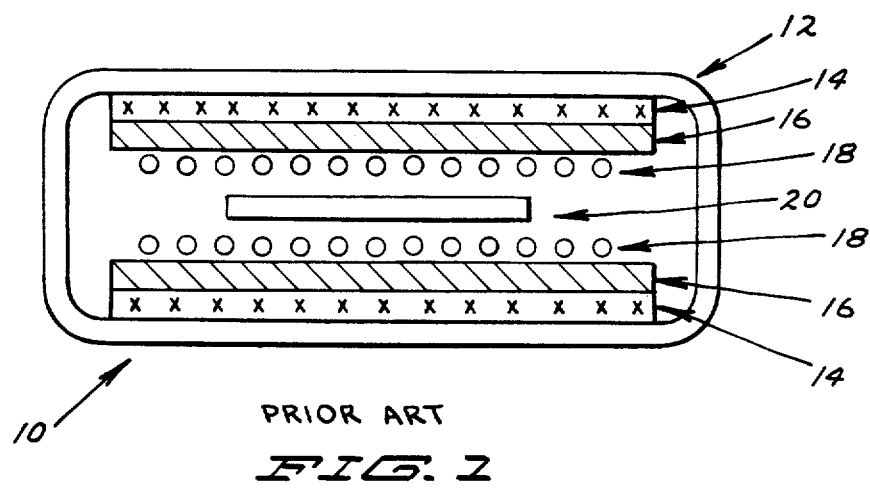

Referring now to FIG. 1, a cross-sectional view of a bubble memory package according to the prior art is shown. A bubble memory device 10 is shown with a shield 12 comprising the outer structure. Within the shield 12 are top and bottom magnets 14, 14 respectively. Top and bottom leveling or smoothing plates 16, 16 respectively are provided between the magnets and the field coil structure 18, 18 top and bottom respectively, shown diagramatically in the figure. A bubble memory chip 20 is provided in the center of the package and is shown only diagramatically. The magnets 14, 14 are of a conventional permanent magnet type and formed as a flat plate. Plates 16, 16 are a high permeability material to help level the loss of flux density normally occurring in the center of the magnet area in the prior art structure. These leveling plates are usually adjacent to the rotating field coil assembly. Since these coils are operated at high frequencies, on the order of 100 to 400 kHz., high eddy current and hysteresis losses can occur if the leveling plates are not formed of low loss materials such as one of the materials categorized as a linear ferrite.

The magnetic flux in the central area of the prior art structure is reduced in a manner which has been characterized by the relevant literature as "self-demagnetizing forces." It is possible to offset this self-demagnetizing loss by increasing the magnetic force in the central area of the magnetic plate. One way of increasing the magnetic force of a magnet is to increase its "length" which corresponds to an increase in the thickness of a magnet in a bubble memory device. Generally, the amount of magnetic material comprising a magnet is increased to increase magnetic flux.

Figure 2:
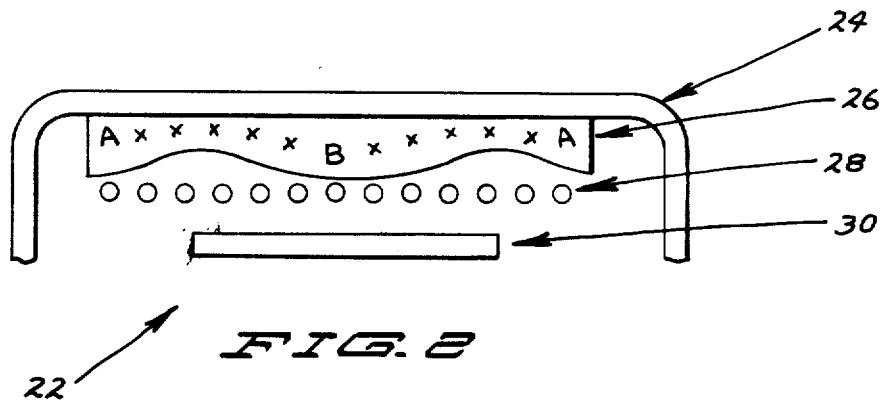

Referring now to FIG. 2, showing an embodiment of the present invention, the magnet has a relatively increased strength in its central area as a result of increasing its "length" or in the case of the planar magnet shown in the figure, the effective thickness of the magnet. Thus, a bubble memory device 22, according to the present invention, is shown having a shield device 24, a specially structured, contoured magnet 26, a rotating field generating coil structure 28 and a bubble memory chip 30. Since the structure is symmetrical about the bubble memory chip 30, the structure is only partially shown. The magnet 26 may be preferably made of a low permeability material having a high electrical resistance such as a ceramic material. More particularly, the magnet may be barium ferrite ceramic. The magnet 26 may be formed in any of a variety of known ways of working with the appropriate materials which may comprise the magnet in a bubble memory device. Thus, the magnet 26 has its thickness, and therefore its strength, increased at the edges, shown at "A" in the figure to offset the affect of fringe magnetic fields at the edge. This edge fringe affect correction needs to be made only if the ultimate size of the magnet must be reduced for the bubble memory chip 30. Further, at the central area of the magnet, shown at "B" in the figure, the thickness of the magnet is increased to offset the self-demagnetization forces in the magnet which occurs as a result of a comparatively high area to length ratio. This local variation in flux density creates a uniform field at the bubble chip.

Figure 3:
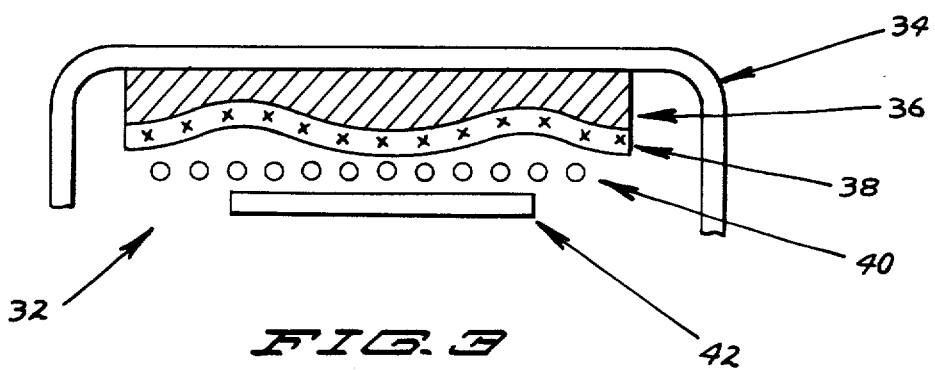

Referring now to FIG. 3, another embodiment 32 of the present invention is shown. As before, a shield structure 34 surrounds an assembly including a rotating field coil package 40 and a bubble memory chip 42. A filler plate 36 is provided immediately internally to the shield 34 and is of an appropriate shape to hold the magnet 38. The actual thickness of the magnet 38 may remain uniform whereas the thickness of the magnet 26 shown in FIG. 2 varied. However, the effective thickness of the magnet 38 is varied. The required variation in the strength of the magnetic field to be imposed upon the bubble chip 42 shown in FIG. 3 to compensate for self-demagnetizing forces is a result of the spacing between the magnet and the chip. Thus, the filler plate 36 causes the magnet 38 to have a very small air gap through which the magnet must act in the central region where the magnet itself produces the weakest field. Although the air gap of the structure shown in FIG. 3 is only represented diagramatically, the actual gap being much smaller than that represented, the principle is that the effect of the magnetic field is enchanced where the magnet itself is weakest by establishing a greater effective thickness by having a shorter effective magnetic flux path length where the need is critical.

Further variations of the invention as shown in FIG. 3, would involve a shaping of the shield structure 34 in a contoured fashion to eliminate the filler plate 36. However, the principle would be the same in that the shield structure 34 would be contoured to shape and position the magnet 38 in the appropriate fashion. There may be other ways of varying the effective thickness of a magnet falling within the scope of the invention but which do not require the actual magnet thickness to be varied.

What is claimed is:

1. A bubble memory structure comprised of:
   a magnetic field shielding structure,
   a bubble memory chip within said shield structure,
   means for generating a rotating magnetic field in the vicinity of said bubble memory chip, and
   means for generating a bias magnetic field consisting of at least one permanent magnet consisting of a single plate of low permeability material having a contoured surface disposed nearest to said bubble memory chip and said permanent magnet being thicker in the central region disposed adjacent said bubble memory chip than in regions disposed closer to the edge of said chip than said central region so that the central portion of said bias magnetic field generating means compensates for self-demagnetizing forces so that the bias magnetic field is essentially uniform at said bubble memory chip in the absence of a high permeability leveling plate and to generate a bias magnetic field stronger in the central area of said means for generating a bias magnetic field than that which would be produced in the central area of a uniformly thick planar device, and
   means for supporting and positioning said permanent magnet.

2. The structure of claim 1 comprised of two similarly shaped magnets disposed on either side of said bubble memory chip.

* * * * *